United States Patent

Nakamura

[11] Patent Number: 5,495,488
[45] Date of Patent: Feb. 27, 1996

[54] ARITHMETIC CIRCUIT HAVING A SIMPLE STRUCTURE FOR PRODUCING AN ERROR NUMERIC VALUE POLYNOMIAL AND AN ERROR LOCATOR POLYNOMIAL

[75] Inventor: Masaru Nakamura, Tokyo, Japan

[73] Assignee: NEC Corporation, Tokyo, Japan

[21] Appl. No.: 186,574

[22] Filed: Jan. 26, 1994

[30] Foreign Application Priority Data

Jan. 27, 1993 [JP] Japan .................................. 5-011318

[51] Int. Cl.$^6$ .............................. G06F 11/10; G06F 15/00; G06F 7/00; H03M 13/00
[52] U.S. Cl. ....................... 371/37.1; 364/746.1; 364/761
[58] Field of Search ................................ 364/746.1, 761, 364/764, 754, 757; 371/37.1, 37.6, 37.8, 38.1, 39.1, 40.1

[56] References Cited

U.S. PATENT DOCUMENTS

| 4,574,361 | 5/1986 | Inagawa et al. | 364/746.1 |
| 4,694,455 | 9/1987 | Koga | 371/37.1 |
| 5,185,711 | 2/1993 | Hattori | 364/746.1 |

FOREIGN PATENT DOCUMENTS 2259378  3/1993  United Kingdom .
2262371  6/1993  United Kingdom .

OTHER PUBLICATIONS

Sugiyama et al., "A method for solving key equation for decoding Goppa codes," INSPEC Abstract Nos. P75009328, C75006843, Jan. 1975.

*Primary Examiner*—Tan V. Mai
*Assistant Examiner*—Emmanuel L. Moise
*Attorney, Agent, or Firm*—Foley & Lardner

[57] ABSTRACT

In an arithmetic circuit for producing an error numeric value polynomial and an error locator polynomial in accordance with Euclid's algorithm, a first producing section (11) produces a quotient polynomial and a remainder polynomial which are obtained on dividing a first polynomial by a second polynomial. A first output section (51) outputs the remainder polynomial as the error numeric value polynomial. A second producing section (54) is supplied with the quotient polynomial and a third polynomial and produces a multiplication polynomial by multiplying the quotient polynomial and the third polynomial. A subtracting section (59-1 to 59(N–1)) is supplied with the multiplication polynomial and a fourth polynomial and subtracts the fourth polynomial from the multiplication polynomial to produce a subtraction polynomial. A second output section (60) outputs the subtraction polynomial as the error locator polynomial.

2 Claims, 4 Drawing Sheets

FIG. 1

PRIOR ART

ARITHMETIC CIRCUIT HAVING A SIMPLE STRUCTURE FOR PRODUCING AN ERROR NUMERIC VALUE POLYNOMIAL AND AN ERROR LOCATOR POLYNOMIAL

BACKGROUND OF THE INVENTION

This invention relates to an arithmetic circuit for producing an error numeric value polynomial and an error locator polynomial in accordance with Euclid's algorithm on correcting bit errors in a received digital signal.

In general, it is necessary to obtain an error numeric value polynomial and an error locator polynomial on correcting bit errors in a received digital signal which may be made from Bose-Chaudhuri-Hocquenghem code or Reed-Solomon code. On producing the error numeric value polynomial and the error locator polynomial, a syndrome polynomial is calculated from the received digital signal. An arithmetic circuit is for producing the error numeric value polynomial and the error locator polynomial by the syndrome polynomial in accordance with Euclid's algorithm.

A conventional arithmetic circuit comprises a quotient polynomial calculating section, an error numeric value polynomial calculating section, and an error locator polynomial calculating section. The quotient polynomial calculating section calculates coefficients of a quotient polynomial as quotient coefficients on the basis of the syndrome polynomial. The error numeric value polynomial calculating section calculates coefficients of the error numeric value polynomial as error numeric value coefficients on the basis of the quotient coefficients. The error numeric value coefficients are produced as a serial data sequence. In addition, the error locator polynomial calculating section calculates coefficients of the error locator polynomial as error locator coefficients on the basis of the quotient coefficients. The error locator coefficients are produced as a serial data sequence.

However, the conventional arithmetic circuit has a complex structure as described hereinafter. Furthermore, it is necessary for the conventional arithmetic circuit to have a serial-parallel converter section which is for use in converting the serial data sequence into a parallel data sequence. As a result, it is difficult to construct the conventional arithmetic circuit by an LSI.

SUMMARY OF THE INVENTION

It is an object of this invention to provide an arithmetic circuit having a simple structure.

It is another object of this invention to provide an arithmetic circuit capable of being easily constructed by an LSI.

It is still another object of this invention to provide an arithmetic circuit capable of calculating an error numeric value polynomial and an error locator polynomial at high speed.

An arithmetic circuit to which this invention is applicable is for producing an error numeric value polynomial and an error locator polynomial in accordance with Euclid's algorithm.

According to a first aspect of this invention, the arithmetic circuit comprises (A) register means for latching first through M-th primary coefficients of a first polynomial, where M represents a positive integer which is not less than two, the first primary coefficient being a highest coefficient of the first polynomial and the M-th primary coefficient being a lowest coefficient of the first polynomial, (B) generating means for generating first through M-th subsidiary coefficients of a second polynomial, the first subsidiary coefficient being a highest coefficient of the second polynomial and the M-th subsidiary coefficient being a lowest coefficient of the second polynomial, (C) divider means for dividing the first primary coefficient by the first subsidiary coefficient to produce an output coefficient, (D) multiplier means for multiplying the output coefficient and each of the second through the M-th subsidiary coefficients to produce first through (M–1)-th multiplied coefficients, (E) exclusive OR means for carrying out an exclusive OR of the second primary through the M-th primary coefficients and the first through the (M–1)-th multiplied coefficients, respectively, to produce first through (M–1)-th exclusive ORed coefficients and to thereby set the first through the (M–1)-th exclusive ORed coefficients as the (M–1)-th primary through the first primary coefficients in the register means, and (F) output means for outputting the first through the (M–1)-th exclusive ORed coefficients as first through (M–1)-th coefficients of the error numeric value polynomial, respectively.

According to a second aspect of this invention, the arithmetic circuit comprises (A) first register means for latching first through M-th primary coefficients of a first polynomial, where M represents a positive integer which is not less than two, the first primary coefficient being a highest coefficient of the first polynomial and the M-th primary coefficient being a lowest coefficient of the first polynomial, (B) generating means for generating first through M-th subsidiary coefficients of a second polynomial, the first subsidiary coefficient being a highest coefficient of the second polynomial and the M-th subsidiary coefficient being a lowest coefficient of the second polynomial, the generating means further generating first through N-th additional coefficients of a third polynomial and first through N-th local coefficients of a fourth polynomial, where N represents a positive integer which is not less than two, the first additional coefficient being a highest coefficient of the third polynomial and the N-th additional coefficient being a lowest coefficient of the third polynomial, the first local coefficient being a highest coefficient of the fourth polynomial and the N-th local coefficient being a lowest coefficient of the fourth polynomial, (C) divider means for dividing the first primary coefficient by the first subsidiary coefficient to produce an output coefficient as a quotient coefficient, (D) first multiplier means for multiplying the output coefficient and each of the second through the M-th subsidiary coefficients to produce first through (M–1)-th multiplied coefficients, (E) first exclusive OR means for carrying out an exclusive OR of the second primary through the M-th primary coefficients and the first through the (M–1)-th multiplied coefficients, respectively, to produce first through (M–1)-th exclusive ORed coefficients and to thereby set the first through the (M–1)-th exclusive ORed coefficients as the (M–1)-th primary through the first primary coefficients in the first register means, (F) second multiplier means for multiplying the output coefficient and each of the first through the N-th additional coefficients to produce first through N-th additional multiplied coefficients, respectively, (G) second register means for latching the first through the N-th additional multiplied coefficients, (H) second exclusive OR means for carrying out an exclusive OR of the second through the N-th additional multiplied coefficients and the first through the (N–1)-th additional multiplied coefficients, respectively, to produce first through (N–1)-th additional exclusive ORed coefficients and to thereby set the first through the (N–1)-th additional exclusive ORed coefficients as the first through the (N–1)-th additional multiplied coefficients in the second register means, (I) additional register means for latching the first additional multiplied coefficient as an additional coefficient, (J) third exclusive OR means for carrying out an exclusive OR of the second through the N-th additional multiplied coefficients and the second through the N-th local coefficients, respectively, to produce first through (N–1)-th local exclusive ORed coefficients, (K) output means for outputting the first through the (N–1)-th local exclusive ORed coefficients, the first additional multiplied coefficient, and the additional coefficient as error locator coefficients of the error locator polynomial.

DESCRIPTION OF THE PREFERRED EMBODIMENT

Figure 1:
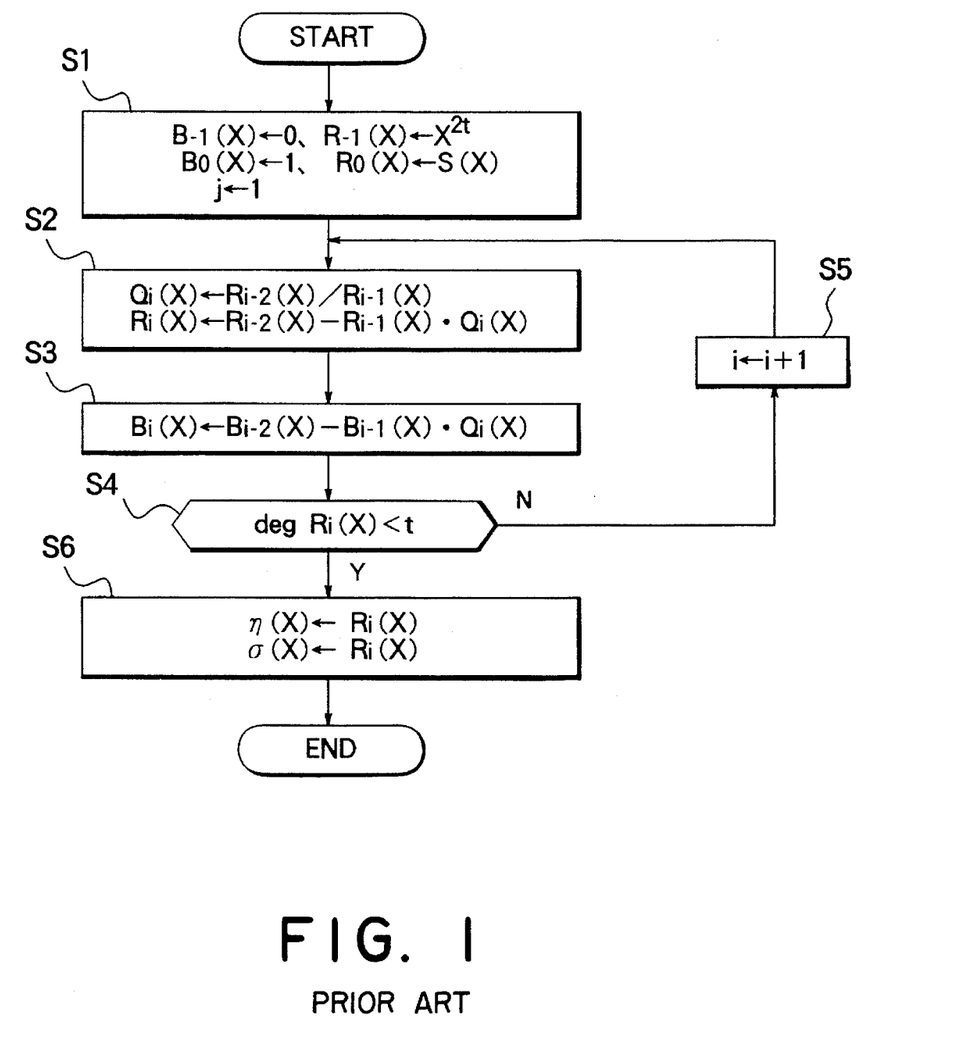
FIG. 1 is a flow chart for describing production of an error numeric value polynomial and an error locator polynomial according to Euclid's algorithm.

Referring to FIG. 1, description will be made as regards Euclid's algorithm. Euclid's algorithm is for use in calculating an error numeric value polynomial and an error locator polynomial which are for use in correcting bit errors in a received digital signal. In Euclid's algorithm, polynomials $R_{i-2}(X)$ and $B_{i-2}(X)$ are set into initial values, respectively, at a first step S1, where i represents a variable which is not less than one. More specifically, $R_{-1}(X)$ is set to $X^{2t}$ as the initial value when i is one, where t represents the number of words in which error correction is performed. $R_0(X)$ is set to S(X) as the initial value when i is two, where S(X) represents a syndrome polynomial which is obtained on the basis of the received digital signal. $B_{-1}(X)$ is set into zero as the initial value when i is one. $B_0(X)$ is set to one as the initial value when i is two.

At a second step S2, operation is carried out to obtain a quotient polynomial $Q_i(X)$ given by:

$$Q_i(X)=R_{i-2}(X)/R_{i-1}(X).$$

Similarly, operation is carried out to obtain a first remainder polynomial $R_i(X)$ given by:

$$R_i(X)=R_{i-2}(X)-R_{i-1}(X)Q_i(X).$$

At a third step S3, operation is carried out to obtain a second remainder polynomial $B_i(X)$ given by:

$$B_i(X)=B_{i-2}(X)-B_{i-1}(X)Q_i(X).$$

At a fourth step S4, operation is carried out to detect whether or not deg $R_i(X)$ is less than the number t. When deg $R_i(X)$ is not less than the number t, the variable i is incremented at a fifth step S5. The fifth step S5 is followed by the second step S2. When the deg $R_i(X)$ is less than the number t, the first remainder polynomial $R_i(X)$ is obtained as the error numeric value polynomial $\eta(X)$ and the second remainder polynomial $B_i(X)$ is obtained as the error locator polynomial $\sigma(X)$ at a sixth step S6.

Figure 2:
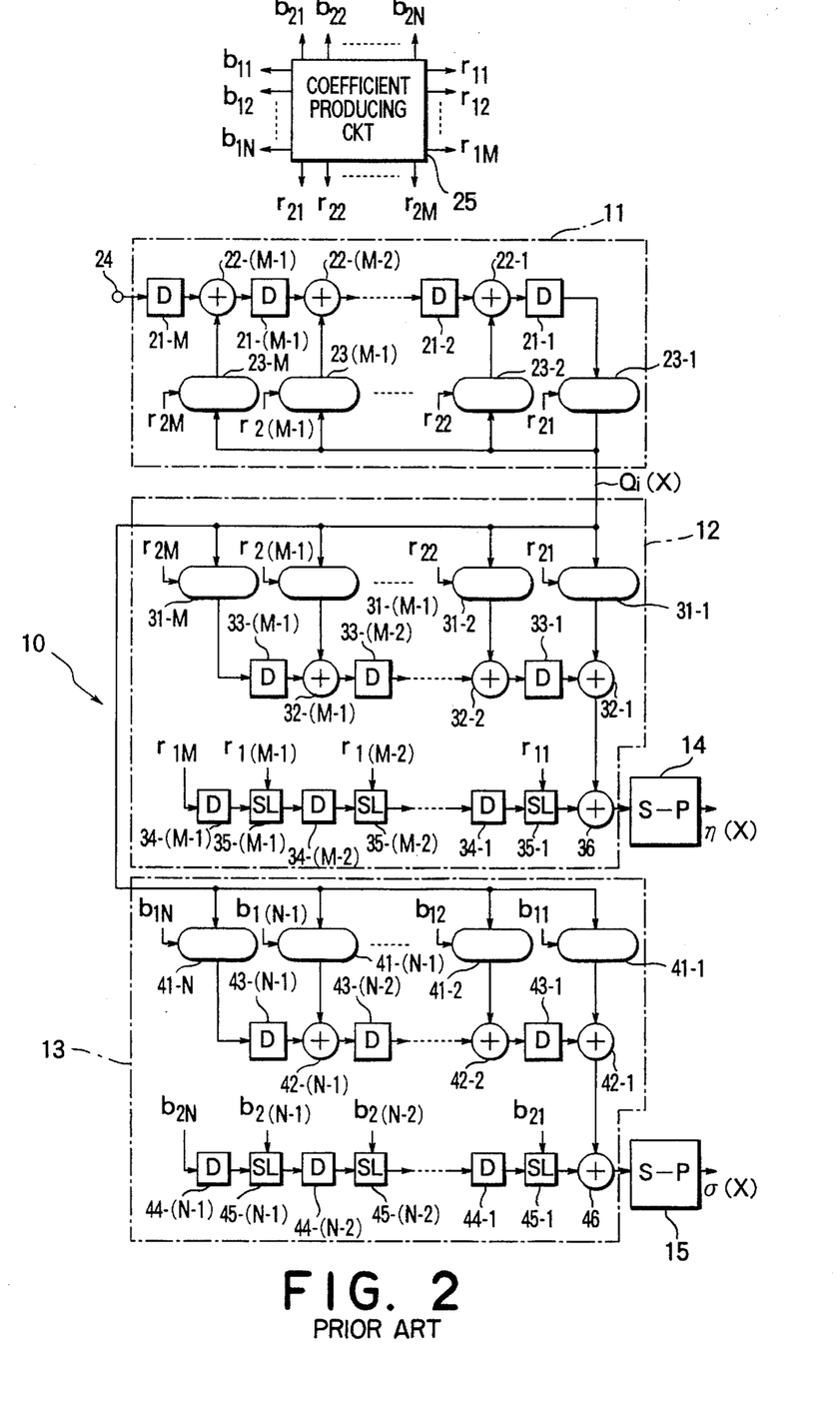
FIG. 2 is a block diagram of a conventional arithmetic circuit.

Referring to FIG. 2, description will proceed to a conventional arithmetic circuit 10 to which the above-mentioned Euclid's algorithm is applicable. The illustrated arithmetic circuit 10 comprises a first calculating circuit 11, a second calculating circuit 12, a third calculating circuit 13, and first and second serial-parallel converters 14 and 15. The first calculating circuit 11 is for calculating the quotient polynomial ($Q_i(X)$). The second calculating circuit 12 is for calculating the error numeric value polynomial ($\eta(X)$). In addition, the third calculating circuit 13 is for calculating the error locator polynomial ($\sigma(X)$).

The first calculating circuit 11 comprises register circuits 21-1 to 21-M, exclusive OR (EXOR) circuits 22-1 to 22-(M–1), and multiplier circuits 23-1 to 23-M, where M represents a positive integer which is not less than two. The register circuit 21-1 is connected to an input terminal 24. The input terminal 24 is given first through M-th primary coefficients $r_{11}$ to $r_{1M}$ of a first polynomial $R_{i-2}(X)$ in the order of the number. The first through the M-th primary coefficients $r_{11}$ to $r_{1M}$ are supplied from a coefficient producing circuit 25 to the input terminal 24. The first primary coefficient $r_{11}$ is a highest coefficient of the first polynomial $R_{i-2}(X)$. The M-th primary coefficient $r_{1M}$ is a lowest coefficient of the first polynomial $R_{i-2}(X)$. As a result, the register circuits 21-1 to 21-M latch the first through the N-th primary coefficients $r_{11}$ to $r_{1M}$, respectively.

The multiplier circuits 23-1 to 23-M are given first through M-th subsidiary coefficients $r_{21}$ to $r_{2M}$ of a second polynomial $R_{i-1}(X)$ from the coefficient producing circuit 25, respectively. The first subsidiary coefficient $r_{21}$ is a highest coefficient of the second polynomial. The M-th subsidiary coefficient is a lowest coefficient $r_{2M}$ of the second polynomial. The second polynomial may be the syndrome polynomial S(X).

The first primary coefficient $r_{11}$ is supplied from the register 21-1 to the multiplier circuit 23-1. The multiplier circuit 23-1 multiplies the first primary coefficient $r_{11}$ and the inverse number of the first subsidiary coefficient $r_{21}$ to produce a first output coefficient. Namely, the multiplier circuit 23-1 divides the first primary coefficient $r_{11}$ by the first subsidiary coefficient $r_{21}$ to produce the first output coefficient. The first output coefficient is delivered from the multiplier circuit 23-1 to the multiplier circuits 23-2 to 23-M and the second and the third calculating circuits 12 and 13.

The multiplier circuits 23-2 to 23-M multiply the first output coefficient and each of the second through the N-th subsidiary coefficients. The outputs of the multiplier circuits 23-2 to 23-M are supplied to the EXOR circuits 22-1 to 22-(M–1), respectively. The EXOR circuit 22-1 carries out an exclusive OR of the second primary coefficient and the output of the multiplier circuit 23-2. The output of the EXOR circuit 22-1 is latched in the register 21-1. Similarly, the outputs of the EXOR circuits 22-2 to 22-(M–1) are latched in the registers 21-2 to 21-(M–1), respectively.

Supplied with the output of the register circuit 21-1, the multiplier circuit 23-1 divides the output of the register circuit 21-1 by the first subsidiary coefficient to produce a second output coefficient. The second output coefficient is supplied to the multiplier circuits 23-2 to 23-M and the second and the third calculating circuits 12 and 13.

In operation similar to the above description, the multiplier circuit 23-1 supplies third through M-th output coefficients to the second and the third calculating circuits 12 and 13. The first through the M-th output coefficients may be collectively called an output coefficient.

As readily understood from the above description, the multiplier circuit 23-1 produces the first through the M-th output coefficients as quotient coefficients of the quotient polynomial $Q_i(X)$ to supply the quotient coefficients to the second and the third calculating circuits 12 and 13.

The second calculating circuit 12 comprises multiplier circuits 31-1 to 31-M which are respectively given first through N-th subsidiary coefficients $r_{21}$ to $r_{2M}$ of the second polynomial $R_{i-1}(X)$ from the coefficient producing circuit 25. Each of the multiplier circuits 31-1 to 31-M are first supplied with the first output coefficient from the first calculating circuit 11. The multiplier circuit 31-1 multiplies the first output coefficient and the inverse number of the first subsidiary coefficient to produce a first secondary coefficient. Namely, the multiplier circuit 31-1 divides the first output coefficient by the first subsidiary coefficient to produce the first secondary coefficient. The multiplier circuits 31-2 to 31-N multiply the first output coefficient and each of the second through the N-th subsidiary coefficients.

The second calculating circuit 12 further comprises EXOR circuits 32-1 to 32-(M−1), register circuits 33-1 to 33-(M−1), register circuits 34-1 to 34-(M−1), selector circuits 35-1 to 35-(M−1), and an additional EXOR circuit 36.

The output of the multiplier circuit 31-M is supplied to the register circuit 33-(M−1) to be latched in the register circuit 33-(M−1). The outputs of the multiplier circuits 31-(N−1) to 31-2 are supplied to the EXOR circuits 32-(M−1) to 32-2, respectively. The EXOR circuits 32-2 to 32-(M−1) carry out an exclusive OR of the outputs of the register circuits 33-2 to 33-(M−1) and the outputs of the multiplier circuits 31-2 to 31-(M−1), respectively. The outputs of the EXOR circuits 32-2 to 32-(M−1) are set in the register circuits 33-1 to 33-(M−2), respectively. The first secondary coefficient is supplied to the EXOR circuit 32-1. The EXOR circuit 32-1 carries out an exclusive OR of the first secondary coefficient and the output of the register circuit 33-1. The output of the EXOR circuit 32-1 is supplied to the additional EXOR circuit 36.

The register circuit 34-(M−1) is supplied with the M-th primary coefficient $r_{1M}$ from the coefficient producing circuit 25 to latch the M-th primary coefficient $r_{1M}$. The selector circuits 35-1 to 35-(M−1) are supplied with the first through the (M−1)-th primary coefficients $r_{11}$ to $r_{1(M-1)}$ from the coefficient producing circuit 25, respectively. The selector circuits 35-1 selects the first primary coefficient $r_{11}$ to supply the first primary coefficient to the EXOR circuit 36. The selector circuits 35-2 to 35-(M−1) select the second through the (M−1)-th primary coefficients $r_{12}$ to $r_{1(M-1)}$ to set the second through the (M−1)-th primary coefficients in the register circuits 34-1 to 34-(M−2), respectively.

Supplied with the first primary coefficient, the EXOR circuit 36 carries out an exclusive OR of the output of the EXOR circuit 32-1 and the first primary coefficient to supply a first numeric value coefficient to the first serial-parallel converter 14.

In operation similar to the above description except that the selector circuits 35-1 to 35-(M−1) select the outputs of the register circuits 34-1 to 34-(M−1), respectively, the EXOR circuit 36 produces second through M-th numeric value coefficients when the second through the M-th output coefficients are supplied from the first calculating circuit 11 to the second calculating circuit 12. The first serial-parallel converter carries out a serial-parallel conversion to produce the first through the M-th numeric value coefficients in parallel.

As readily understood from the above description, the second calculating circuit 12 produces numeric value coefficients of the error numeric value polynomial $\eta(X)$.

The third calculating circuit 13 comprises multiplier circuits 41-1 to 41-N, EXOR circuits 42-1 to 42-(N−1), register circuits 43-1 to 43-(N−1), register circuits 44-1 to 44-(N−1), selector circuits 45-1 to 45-(N−1), and an EXOR circuit 46, where N represents a positive integer which is not less than two.

The multiplier circuits 41-1 to 41-N are given first through N-th additional coefficients $b_{11}$ to $b_{1N}$ of a third polynomial $B_{i-1}(X)$ from the coefficient producing circuit 25, respectively. The first additional coefficient $b_{11}$ is a highest coefficient of the third polynomial $B_{i-1}(X)$. The N-th additional coefficient $b_{1N}$ is a lowest coefficient of the third polynomial $B_{i-1}(X)$.

The register circuit 44-(N−1) is supplied with an N-th local coefficient $b_{2N}$ of a fourth polynomial $B_{i-2}(X)$ from the coefficient producing circuit 25 to latch the N-th local coefficient. The selector circuits 45-1 to 45-(N−1) are supplied with the first through the (N−1)-th local coefficients $b_{21}$ to $b_{2(N-1)}$ of the fourth polynomial $B_{i-1}(X)$ from the coefficient producing circuit 25, respectively. The first local coefficient $b_{21}$ is a highest coefficient of the fourth polynomial $B_{i-2}(X)$. The N-th local polynomial $b_{2N}$ is a lowest coefficient of the fourth polynomial $B_{i-2}(X)$.

Inasmuch as operation is carried out in the third calculating circuit 13 in operation similar to the second calculating circuit 12, description will be omitted in the third calculating circuit 13. The third calculating circuit 13 produces first through N-th locator coefficients of the error locator polynomial $\sigma(X)$ in serial. The second serial-parallel converter 15 carries out serial-parallel conversion to produce the first through the N-th locator coefficients in parallel.

As readily understood from the above description, the conventional arithmetic circuit has a complex structure. As a result, it is difficult to calculate the error numeric value polynomial and the error locator polynomial at a high speed. Furthermore, the conventional arithmetic circuit must have the first and the second serial-parallel converters.

Figure 3:
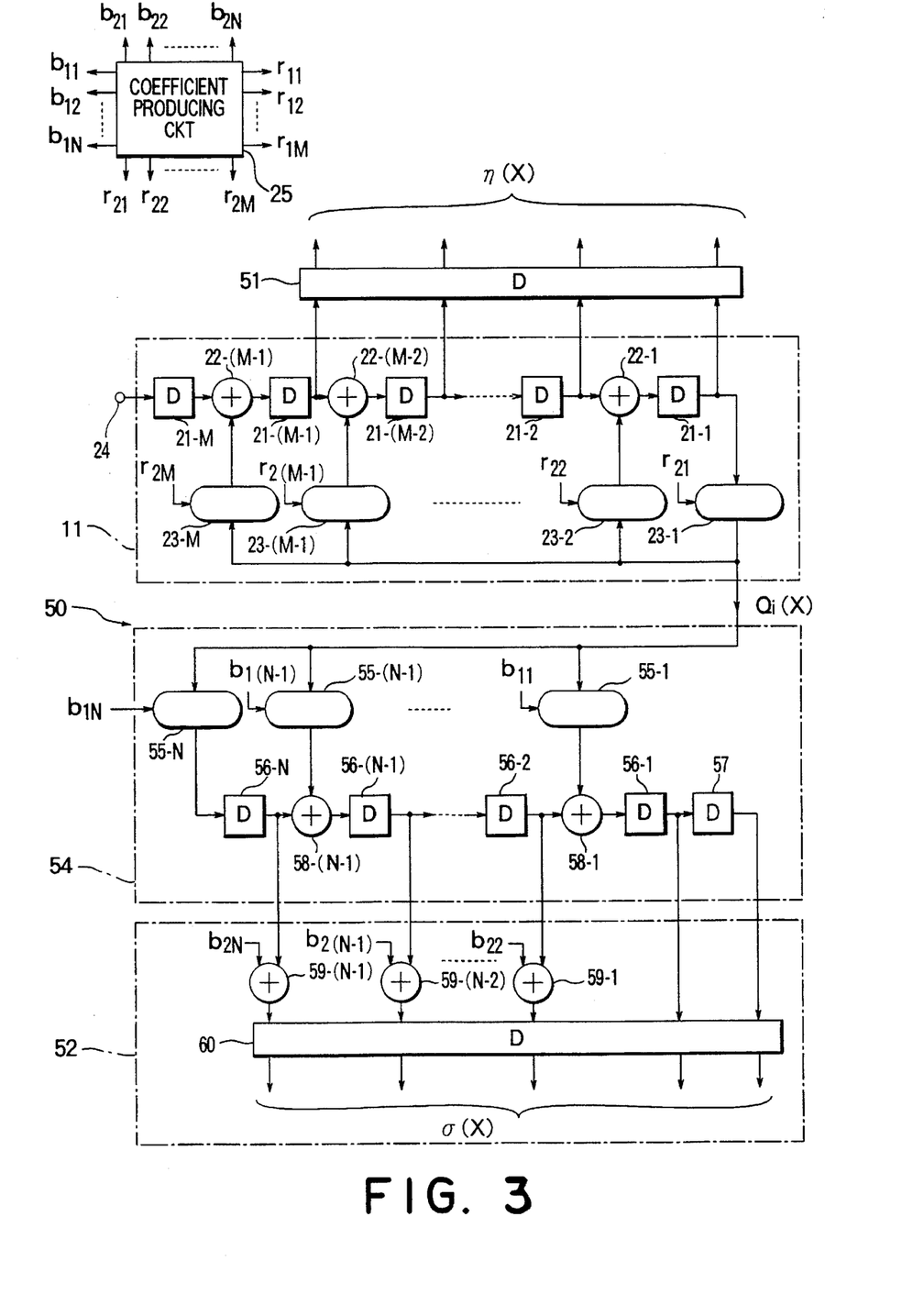
FIG. 3 is a block diagram of an arithmetic circuit according to a preferred embodiment of this invention.

Referring to FIG. 3, description will proceed to an arithmetic circuit according to a preferred embodiment of this invention. The illustrated arithmetic circuit is different in structure from the arithmetic circuit 10 illustrated in FIG. 2 and is therefore designated afresh by a reference numeral 50. The arithmetic circuit 50 comprises similar parts which are designated by like reference numerals.

The arithmetic circuit 50 comprises a first output circuit 51, a second output circuit 52, and a fourth calculating circuit 54 in addition to the first calculating circuit 11.

The first output circuit 51 is a register circuit which is connected to the first calculating circuit 11. More particularly, the first output circuit 51 is given the outputs of the register circuits 21-1 to 21-(M−1). The first output circuit 51 produces the outputs of the register circuits 21-1 to 21-(M−1) as the numeric value coefficients of the error numeric value polynomial $\eta(X)$.

As described in conjunction with FIG. 2, the first calculating circuit 11 produces the first through the M-th output coefficients. The first through the M-th output coefficients are supplied to a fourth calculating circuit 54.

The fourth calculating circuit 54 comprises multiplier circuits 55-1 to 55-N, register circuits 56-1 to 56-N, an additional register circuit 57, and EXOR circuits 58-1 to 58-(N−1). The multiplier circuits 55-1 to 55-N are given the first through the N-th additional coefficients $b_{11}$ to $b_{2N}$ from the coefficient producing circuit 25, respectively. In addition, each of the multiplier circuits 55-1 to 55-N is supplied with first through M-th output coefficients. The output of the multiplier circuit 55-N is latched in the register circuit 56-N.

The outputs of the multiplier circuits 55-1 to 55-(N–1) are supplied to the EXOR circuits 58-1 to 58-(N–1), respectively. The EXOR circuits 58-1 to 58-(N–1) carry out an exclusive OR of the outputs of the multiplier circuits 55-1 to 55-(N–1) and the outputs of the register circuits 56-2 to 56-N. The outputs of the EXOR circuits 58-1 to 58-(N–1) are latched in the register circuits 56-1 to 56-(N–1), respectively. In addition, the outputs of the register circuits 56-1 to 56-N and the additional register circuit 56 are supplied with the second output section 52.

The second output section 52 comprises EXOR circuits 59-1 to 59-(N–1) and a local register circuit 60. The EXOR circuits 59-1 to 59-(N–1) are supplied with the outputs of the register circuits 56-2 to 56-N, respectively. In addition, the EXOR circuits 59-1 to 59-(N–1) are given the first through the (N–1)-th local coefficients $b_{21}$ to $b_{2(N-1)}$ from the coefficient producing circuit 25. The outputs of the EXOR circuits 59-1 to 59-(N–1) are supplied to the local register circuit 60. The local register circuit 60 is further supplied with the outputs of the register circuit 56-1 and the additional register circuit 57. The local register circuit 60 produces the outputs of the EXOR circuits 59-1 to 59-(N–1), the register circuit 56-1, and the additional register circuit 57 as the error locator coefficients of the error locator polynomial $\sigma(X)$.

Now, description will be made as regards Euclid's algorithm by an example for a better understanding of this invention.

It will be assumed that the received digital signal is made from a cyclic code which has a period of $2^4-1$ and which is defined on an extension Galois field $GF(2^4)$. It will be surmised that a generator polynomial $G(X)$ having an element $\alpha$ as a root is given by:

$$G(X)=X^4+X+1.$$

Furthermore, it will be surmised that the syndrome polynomial $S(X)$ is given by:

$$S(X)=\alpha^5 X^3+\alpha^{13}X^2+\alpha^{12}X+\alpha^2.$$

Under the circumstances, each of zero, one, and $\alpha$ is an element of the extension Galois field $GF(2^4)$. Inasmuch as $\alpha^4=\alpha+1$, first through sixteenth elements exist on the extension Galois field $GF(2^4)$. The first through the sixteenth elements are represented as $0, 1, \alpha, \alpha^2, \ldots, \alpha^{14}$, respectively. On carrying out multiplication among the first through the sixteenth elements on the extension Galois field $GF(2^4)$, the first through the sixteenth elements are at first added into a sum element. A quotient and a remainder are obtained by dividing the sum element by fifteen. The remainder becomes to the result of multiplication.

Each of the elements may be represented by a vector having components. Each of addition and subtraction is defined by an exclusive OR among the components of the vectors on the extension Galois field $GF(2^4)$.

Again referring to FIG. 1, the first subtraction $R_{-1}(X)/R_0(X)$ is given by:

```
                              Q₁(X)
                           ┌───────┐
        R₀(X) = S(X)       α¹⁰  α³
       ┌─────────────┐    ┌──────────────┐
        α⁵  α¹³  α¹²  α²  │ 1 ←──────R₋₁(X)
                           │ 1  α⁸  α⁷  α¹²
                           ──────────────
                              α⁸  α⁷  α¹²
                              α⁸  α¹  α⁰  α⁵
                           ──────────────
                                 α¹⁴  α¹¹  α⁵
                           └──────┬───────┘
                                R₁(X)
```

The second subtraction $R_0(X)/R_1(X)$ is given by:

```
                         Q₂(X)
                       ┌───────┐
        R₁(X)           α⁶  α⁰
      ┌────────┐      ┌──────────────────┐
       α¹⁴ α¹¹ α⁵     │ α⁵  α¹³  α¹²  α² ←─── R₀(X)
                       │ α⁵  α²   α¹¹
                       ──────────────
                           α¹⁴  α⁰   α²
                           α¹⁴  α¹¹  α⁵
                       ──────────────
                                α¹²  α¹
                         └──────┬──────┘
                              R₂(X)
```

In the second subtraction, $\alpha^{14} \times \alpha^6$ is made into $\alpha^{20}=\alpha^{20-15}=\alpha^5$. $\alpha^{13}$ is represented as $(\alpha^4)^2\alpha^4\alpha=(\alpha+1)^2(\alpha+1)\alpha=\alpha^3+\alpha^2+1$. $\alpha^3+\alpha^2+1$ is represented as $(1,1,0,1)$ on a vector field. $\alpha^2$ is represented as $(0,1,1,1)$ on the vector field. Therefore, $\alpha^{13}-\alpha^2$ is represented as $(1,1,0,1)-(0,1,0,1)=(1,0,0,1)$ on the vector field. $(1,0,0,1)$ corresponds to $\alpha^3+1$. On the other hand, $\alpha^{14}$ is made into $\alpha^{13}\alpha=(\alpha^3+\alpha^2+1)\alpha=\alpha^4+\alpha^3+\alpha=\alpha^3+1$. As a result, $\alpha^{13}-\alpha^2$ is equal to $\alpha^{14}$.

From the result of the first subtraction, $Q_1(X)$ is given by:

$$Q_1(X)=\alpha^{10}X+\alpha^3.$$

$R_1(X)$ is given by:

$$R_1(X)=\alpha^{14}X^2+\alpha^{11}X+\alpha^5.$$

From the result of the second subtraction, $Q_2(X)$ is given by:

$$Q_2(X)=\alpha^6 X+1.$$

$R_2(X)$ is given by:

$$R_2(X)=\alpha^{12}X+\alpha.$$

Inasmuch as deg $R_2(X)$ is lower than two, $R_2(X)$ becomes to the error numeric value polynomial $\eta(X)$.

Figure 4:
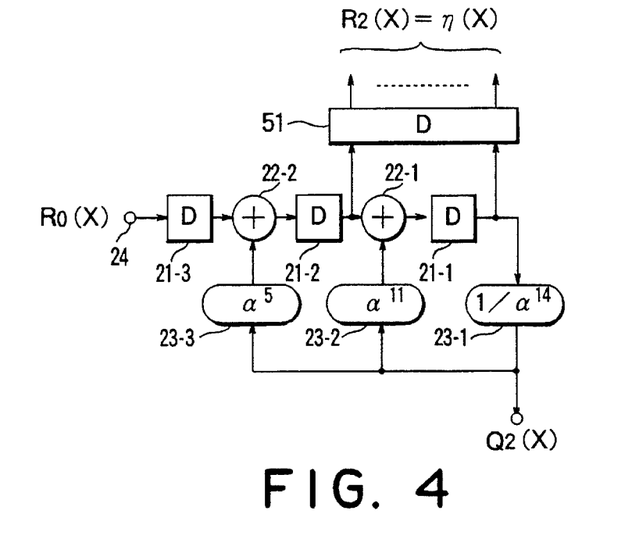
FIG. 4 is a block diagram for describing operation of an error numeric value polynomial calculating circuit illustrated in FIG. 3.

Referring to FIG. 4, description will proceed to the first calculating circuit 11 illustrated in FIG. 3. In the illustrated example, the integer M is equal to three.

At a first operation of the second subtraction, the multiplier circuits 23-1 to 23-3 are supplied with the coefficients $\alpha^{14}$, $\alpha^{11}$, and $\alpha^5$, respectively. The input terminal is supplied with the coefficients $\alpha^5$, $\alpha^{13}$, $\alpha^{12}$, and $\alpha^2$ in the order of $\alpha^5$, $\alpha^{13}$, $\alpha^{12}$, and $\alpha^2$. As a result, the register circuits 21-1 to 21-3 latch the coefficients $\alpha^5$, $\alpha^{13}$, and $\alpha^{12}$, respectively. Under the circumstances, the multiplier circuit 23-1 divides the coefficient $\alpha^5$ by the coefficient $\alpha^{14}$ to produce an output coefficient $\alpha^5/\alpha^{14}$ as the first output coefficient. $\alpha^5/\alpha^{14}$ is represented as $\alpha^6$. The output coefficient $\alpha^6$ is delivered to the multiplier circuits 23-2 and 23-3 and the fourth calculating circuit 53. The multiplier circuits 23-2 multiplies the output coefficient $\alpha^6$ and the coefficient $\alpha^{11}$ to produce a coefficient $\alpha^2$. Similarly, the multiplier circuits 23-3 multiplies the output coefficient $\alpha^2$ and the coefficient $\alpha^5$ to produce a coefficient $\alpha^{11}$.

The EXOR circuit 22-1 carries out the exclusive OR of the coefficients $\alpha^2$ and $\alpha^{13}$ to produce a coefficient $\alpha^{14}$. The coefficient $\alpha^{14}$ is latched in the register circuit 21-1. The EXOR circuit 22-2 carries out the exclusive OR of the coefficients $\alpha^{11}$ and $\alpha^{12}$ to produce a coefficient $\alpha^0$. The coefficient $\alpha^0$ is latched in the register circuit 21-2. At that time, the coefficient $\alpha^2$ is latched in the register circuit 21-3.

In operation similar to the first operation, the multiplier circuit 23-1 produces a coefficient $\alpha^0$ as the second output coefficient at a second operation of the second subtraction. At the second operation, the register circuits 21-1 and 21-2 latch coefficients $\alpha^{12}$ and $\alpha^1$, respectively. The output register circuit latches the coefficients $\alpha^{12}$ and $\alpha^1$ at the second operation to produce the coefficients $\alpha^{12}$ and $\alpha^1$ as the numeric value coefficients in parallel.

Turning to FIG. 2, the polynomial $B_1(X)$ is given by:

$$B_1(X) = B_{-1}(X) - B_0(X)Q_1(X).$$

The polynomial $B_2(X)$ is given by:

$$B_2(X) = B_0(X) - B_1(X)Q_2(X).$$

The polynomial represents the error locator polynomial $\sigma(X)$.

As described in conjunction with FIG. 2, the polynomial $B_{-1}(X)$ is set to zero. The polynomial $B_0(X)$ is set to one which is representative of $\alpha^0$. Inasmuch as $Q_1(X) = \alpha^{10}X + \alpha^3$ and $Q_2(X) = \alpha^6 X + 1$, the polynomial $B_1(X)$ is given by:

$$B_1(X) = Q_1(X) = \alpha^{10}X + \alpha^3$$

In addition, the polynomial $B_2(X)$ is given by:

$$\begin{aligned} B_2(X) &= \alpha^0 - (\alpha^{10}X + \alpha^3)(\alpha^6 X + 1) \\ &= \alpha^1 X^2 + \alpha^{13} X + \alpha^{14}. \end{aligned}$$

Figure 5:
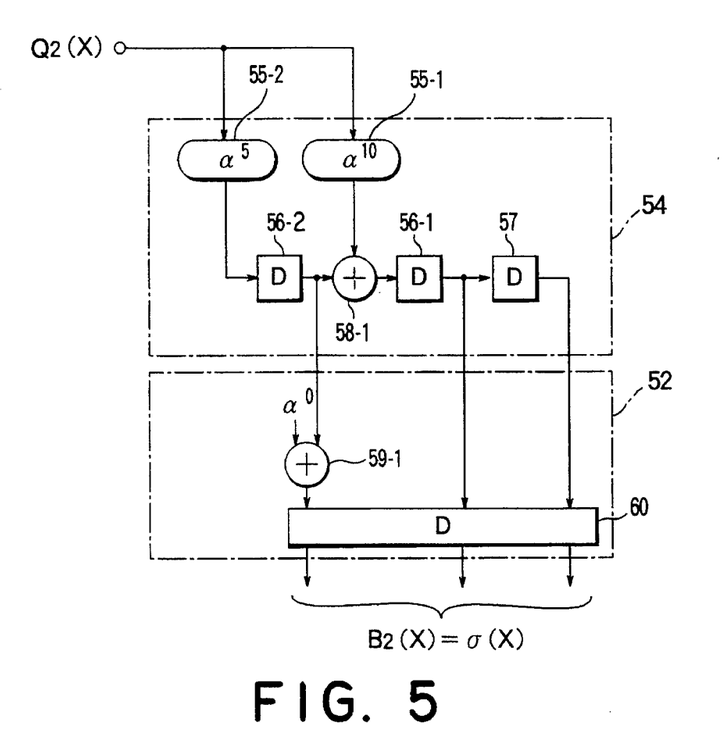
FIG. 5 is a block diagram for describing operation of an error locator polynomial calculating circuit illustrated in FIG. 3.

Referring to FIG. 5, description will proceed to the fourth calculating circuit 54 and the second output circuit 52 illustrated in FIG. 3. In the illustrated example, the number N is equal to two.

The multiplier circuits 55-1 and 55-2 are supplied with the coefficients $\alpha^{10}$ and $\alpha^3$, respectively In addition, the EXOR circuit 58-1 is supplied with the coefficient $\alpha^0$.

The coefficient $\alpha^6$ is delivered to the multiplier circuits 55-1 and 55-2 from the first calculating circuit 11 illustrated in FIG. 4. The multiplier circuit 55-1 multiplies the coefficient $\alpha^{10}$ and the coefficient $\alpha^6$ to produce a coefficient $\alpha^1$. The coefficient $\alpha^1$ is supplied to the EXOR circuit 58-1.

The EXOR circuit 58-1 carries out the exclusive OR of the coefficient $\alpha^1$ and the output of the register circuit 56-2. Inasmuch as the register circuit 56-2 is set to the initial state, the EXOR circuit 58-1 produces the coefficient $\alpha^1$ to set the coefficient $\alpha^1$ in the register circuit 56-1.

Similarly, the multiplier circuit 55-2 multiplies the coefficient $\alpha^3$ and the coefficient $\alpha^6$ to produce a coefficient $\alpha^9$. The coefficient $\alpha^9$ is supplied to the register circuit 56-2 to be latched in the register circuit 56-2.

The multiplier circuits 55-1 and 55-2 are supplied with the coefficient $\alpha^0$ from the first calculating circuit 11. The multiplier circuit 55-1 multiplies the coefficient $\alpha^{10}$ and the coefficient $\alpha^0$ to produce the coefficient $\alpha^{10}$. The coefficient $\alpha^{10}$ is supplied to the EXOR circuit 58-1.

The EXOR circuit 58-1 carries out the exclusive OR of the coefficient $\alpha^1$ and the output of the register circuit 56-2 that is the coefficient $\alpha^9$ to produce the coefficient $\alpha^{13}$. The coefficient $\alpha^{13}$ is latched in the register circuit 56-1. Furthermore, the register circuit 57 latches the coefficient $\alpha^1$.

The multiplier circuit 55-2 multiplies the coefficient $\alpha^3$ and the coefficient $\alpha^0$ to produce the coefficient $\alpha^3$. The coefficient $\alpha^3$ is supplied to the register circuit 56-2 to be latched in the register circuit 56-2.

In the above-mentioned condition, the register circuit 57, 56-1, and 56-2 latch the coefficients $\alpha^1$, $\alpha^{13}$, and $\alpha^3$. The coefficients $\alpha^1$ and $\alpha^{13}$ are supplied with the local register circuit 60 to be latched in the local register circuit 60. On the other hand, the coefficient $\alpha^3$ is supplied to the EXOR circuit 59-1. The EXOR circuit 59-1 carries out the exclusive OR of the coefficients $\alpha^3$ and $\alpha^0$. Namely, the EXOR circuit 59-1 carries out $\alpha^0 - \alpha^3 = \alpha^{14}$ to produce the coefficient $\alpha^{14}$. The coefficient $\alpha^{14}$ is supplied to the local register circuit 60 to be latched in the local register circuit 60. The local register circuit 60 produces the coefficients $\alpha^1$, $\alpha^{13}$, and $\alpha^{14}$ as the locator coefficients of the error locator polynomial in parallel.

What is claimed is:

1. An arithmetic circuit for producing error locator coefficients of an error locator polynomial in accordance with Euclid's algorithm, said arithmetic circuit comprising:

first through M-th primary register circuits for latching first through M-th primary coefficients of a first polynomial, respectively, where M represents a positive integer greater than one, said first primary coefficient being a highest coefficient of said first polynomial and said M-th primary coefficient being a lowest coefficient of said first polynomial;

a generating circuit for generating first through M-th subsidiary coefficients of a second polynomial, said first subsidiary coefficient being a highest coefficient of said second polynomial and said M-th subsidiary coefficient being a lowest coefficient of said second polynomial, said generating circuit further generating first through N-th additional coefficients of a third polynomial, where N represents a positive integer greater than one, said first additional coefficient being a highest coefficient of said third polynomial and said N-th additional coefficient being a lowest coefficient of said third polynomial, said generating circuit still further generating first through N-th local coefficients of a fourth polynomial, said first local coefficient being a highest coefficient of said fourth polynomial and said N-th local coefficient being a lowest coefficient of said fourth polynomial;

a divider circuit for dividing said first primary coefficient by said first subsidiary coefficient to produce an output coefficient;

first through (M–1)-th primary multiplier circuits for multiplying said output coefficient and said second through said M-th subsidiary coefficients to produce first through (M–1)-th multiplied coefficients, respectively;

first through (M–1)-th primary exclusive OR circuits for carrying out an exclusive OR of said second through said M-th primary coefficients and said first through (M–1)-th multiplied coefficients, respectively, to produce first through (M–1)-th exclusive ORed coefficients and to thereby set said first through said (M–1)- th exclusive ORed coefficients as said (M−1)-th through said first primary coefficients in said first through said (M−1)-th primary register circuits, respectively;

first through N-th additional multiplier circuits for multiplying said output coefficient and said first through said N-th additional coefficients to produce first through N-th additional multiplied coefficients, respectively;

first through N-th additional register circuits for latching said first through N-th additional multiplied coefficients, respectively;

first through (N−1)-th additional exclusive OR circuits for carrying out an exclusive OR of said second through said N-th additional multiplied coefficients and said first through (N−1)-th additional multiplied coefficients, respectively, to produce first through (N−1)-th additional exclusive ORed coefficients and to thereby set said first through said (N−1)-th additional exclusive ORed coefficients as said first through said (N−1)-th additional multiplied coefficients in said first through said (N−1)-th additional register circuits, respectively;

a subsidiary register circuit for latching said first additional multiplied coefficient as a subsidiary coefficient;

first through (N−1)-th local exclusive OR circuits for carrying out an exclusive OR of said second through said N-th additional multiplied coefficients and said second through said N-th local coefficients, respectively, to produce first through (N−1)-th local exclusive ORed coefficients; and an output register circuit connected to said first through said (N−1)-th local exclusive OR circuits, said first additional register circuit, and said subsidiary register circuit for latching said first through said (N−1)-th local exclusive ORed coefficients, said first additional multiplied coefficient, and said subsidiary coefficient to produce said first through said (N−1)-th local exclusive ORed coefficients, said first additional multiplied coefficient, and said subsidiary coefficient as said error locator coefficients of said error locator polynomial.

2. An arithmetic circuit for producing numeric value coefficients of an error numeric value polynomial in accordance with Euclid's algorithm, said arithmetic circuit comprising:

first through M-th register circuits for latching first through M-th primary coefficients of a first polynomial, respectively, where M represents a positive integer greater than one, said first primary coefficient being a highest coefficient of said first polynomial and said M-th primary coefficient being a lowest coefficient of said first polynomial;

a generating circuit for generating first through M-th subsidiary coefficients of a second polynomial, said first subsidiary coefficient being a highest coefficient of said second polynomial and said M-th subsidiary coefficient being a lowest coefficient of said second polynomial;

a divider circuit for dividing said first primary coefficient by said first subsidiary coefficient to produce an output coefficient;

first through (M−1)-th multiplier circuits for multiplying said output coefficient and said second through said M-th subsidiary coefficients to produce first through (M−1)-th multiplied coefficients, respectively;

first through (M−1)-th exclusive OR circuits for carrying out an exclusive OR of said second through said M-th primary coefficients and said first through (M−1)-th multiplied coefficients, respectively, to produce first through (M−1)-th exclusive ORed coefficients and to thereby set said first through said (M−1)-th exclusive ORed coefficients as said (M−1)-th through said first primary coefficients in said first through said (M−1)-th register circuits; and an output register circuit connected to said first through said (M−1)-th register circuits for latching said first through said (M−1)-th exclusive ORed coefficients to produce said first through said (M−1)-th exclusive ORed coefficients as said numeric value coefficients of said error numeric value polynomial.

* * * * *